United States Patent [19]

Okada et al.

[11] Patent Number: 5,283,541
[45] Date of Patent: Feb. 1, 1994

[54] MAGNETOSTATIC WAVE DEVICE HAVING A MULTI-PORTION HOLDER

[75] Inventors: Takekazu Okada; Satoru Shinmura, both of Nagaokakyo; Yasuhide Kamado, Osaka; Fumio Kanaya, Nagaokakyo, all of Japan

[73] Assignee: Murata Manufacturing Co., Ltd., Kyoto, Japan

[21] Appl. No.: 857,197

[22] Filed: Mar. 25, 1992

[30] Foreign Application Priority Data

Mar. 29, 1991 [JP] Japan .................................. 3-92703

[51] Int. Cl.⁵ .......................... H03H 7/00; H05K 5/02
[52] U.S. Cl. ..................................... 333/156; 333/202; 333/219.2
[58] Field of Search ............... 333/148, 156, 201, 202, 333/219.2

[56] References Cited

U.S. PATENT DOCUMENTS

| | | | |
|---|---|---|---|
| 4,605,911 | 8/1986 | Jin | 333/148 X |
| 4,714,904 | 12/1987 | Willems | 333/148 |
| 4,857,871 | 8/1989 | Harris | 333/202 |
| 4,983,936 | 1/1991 | Murakami et al. | 333/202 |

*Primary Examiner*—Benny Lee
*Attorney, Agent, or Firm*—Jordan and Hamburg

[57] ABSTRACT

The magnetostatic wave device 10 includes a holder 12 made of synthetic resin. The holder 12 is provided with a number of recesses 14, 16, 22a, 22b, 24a and 24b. In the holder 12, a magnet 30 is housed in the recess 14, and a YIG element 32 as a ferromagnetic element is housed in the recess 16, and transducers 34a and 34b are housed in the recesses 22a, 22b, 24a and 24b.

11 Claims, 11 Drawing Sheets

F I G. 2
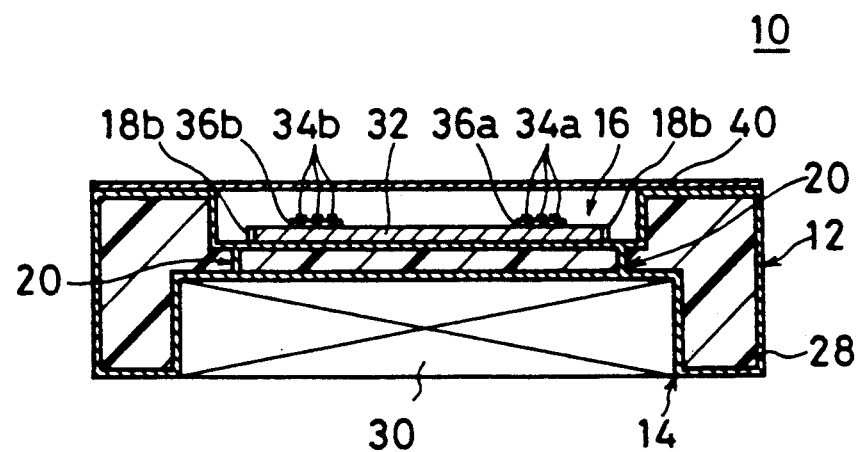

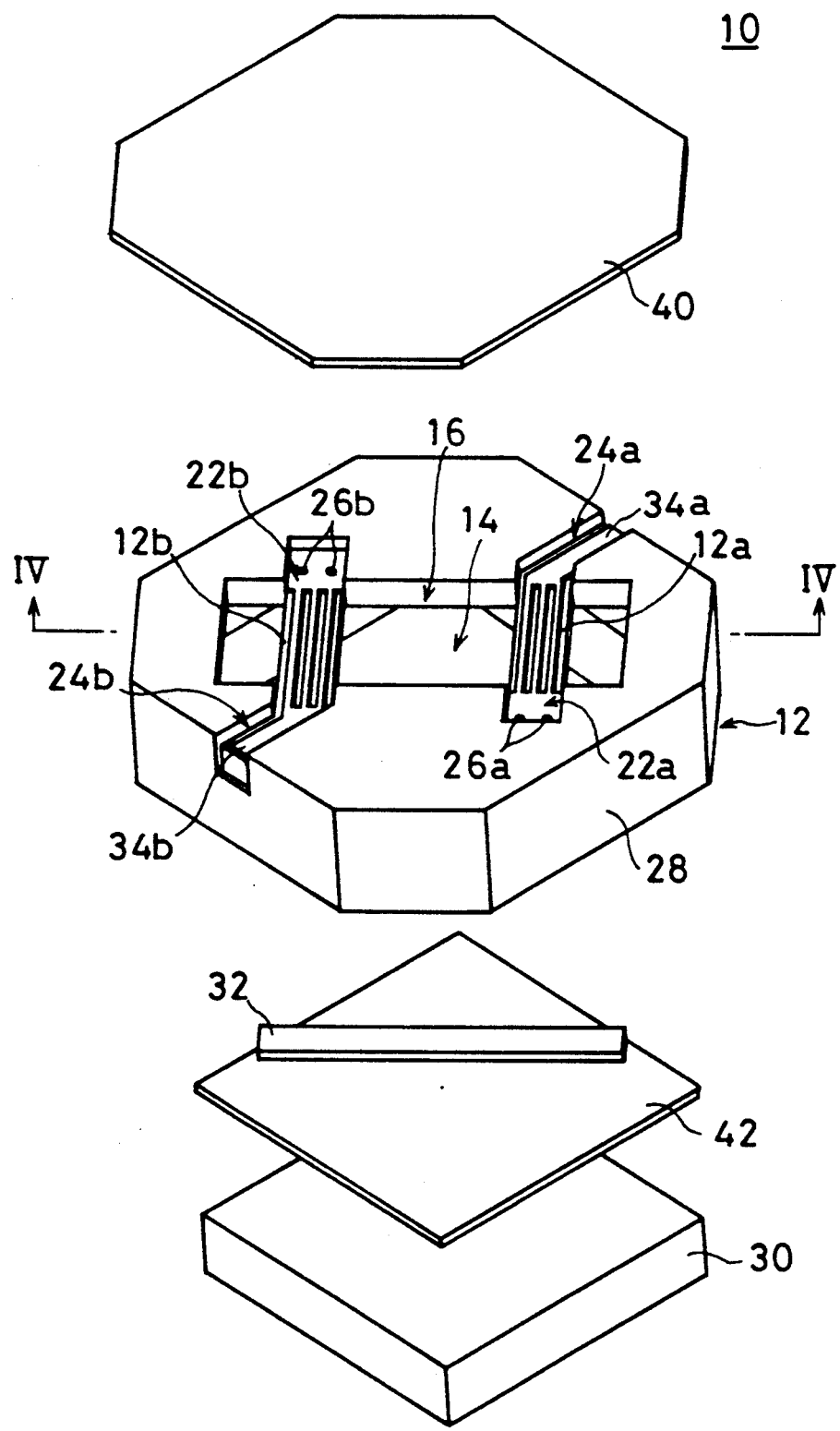

F I G. 8
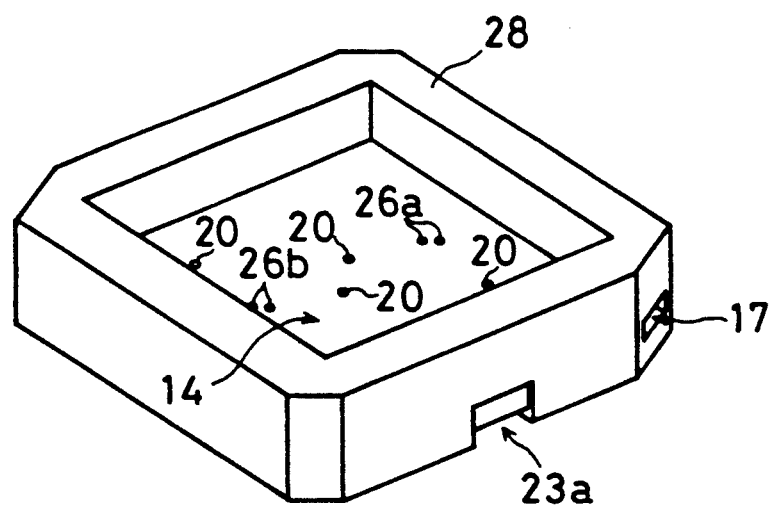

F I G. 9
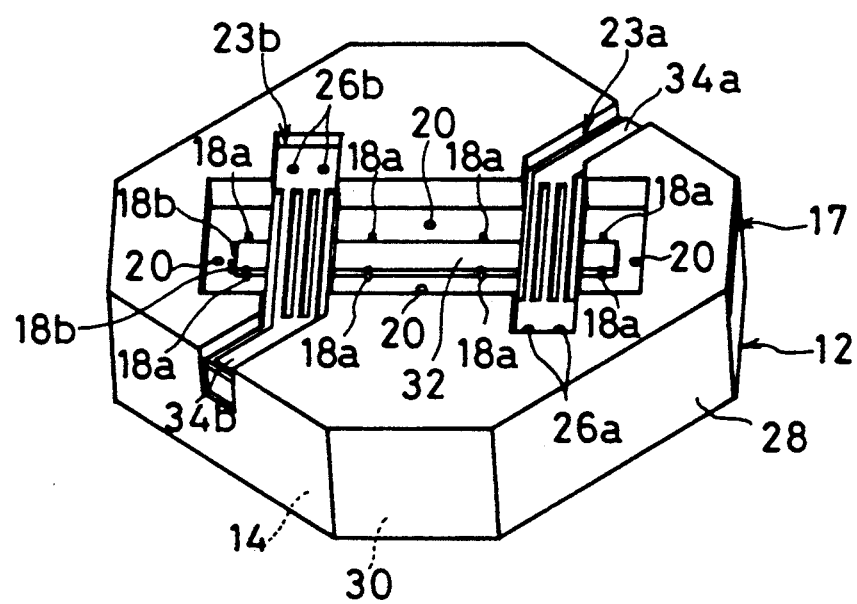

F I G. 10
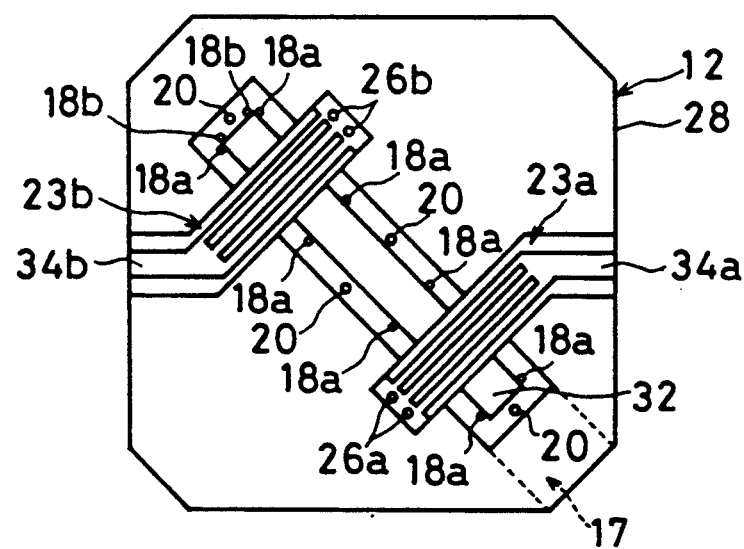

MAGNETOSTATIC WAVE DEVICE HAVING A MULTI-PORTION HOLDER

BACKGROUND OF THE INVENTION

1. Field of the Invention

This invention relates to a magnetostatic wave device and, more particularly, to a magnetostatic wave device which comprises a ferromagnetic element such as a YIG (yttrium iron garnet) element, a magnet for applying a magnetic field to the ferromagnetic element, and transducers provided in conjunction with the ferromagnetic element.

2. Description of the Prior Art

FIG. 11 is an illustrative sectional view showing one example of the conventional magnetostatic wave devices which is disclosed in Japanese Utility Model Application No. 148370/1989 (Japanese Utility Model Provisional Publication No. 86601/1991). The magnetostatic wave device 1 includes a chassis 2 made of metal, and in the chassis 2, a dielectric substrate 3 made of, for example, alumina is provided midway along the height of a chassis. On the undersurface of the dielectric substrate 3, a YIG element 4 of, for example, a strip is provided, and under the YIG element 4, an earth plate 5 is disposed. Furthermore, on the top face of the dielectric substrate 3, two spaced apart transducers (not shown) are provided. These transducers are respectively connected to two coaxial connectors (not shown) which penetrate a side wall of the chassis 2.

Furthermore, in the chassis 2, magnets 6a and 6b for applying a d.c. magnetic field to the YIG element 4 are disposed with the dielectric substrate 3 between them.

In the magnetostatic wave device 1, for example, when a signal is applied to one transducer by inputting the signal to one coaxial connector, the signal is excited as a magnetostatic forward volume wave (MSFVW). The magnetostatic forward volume wave is propagated toward the other transducer on the YIG element 4 and received by the transducer to output it as a signal from the other coaxial connector.

Furthermore, into the top wall of the chassis 2 of the magnetostatic wave device 1, two adjusting screws 7a and 7b are driven. These adjusting screws 7a and 7b are for adjusting a distribution of a magnetic field applied to the YIG element 4. Still furthermore, into the bottom wall of the chassis 2, another adjusting screw 8 is threaded, at the end of which another magnet 9 is fixed. The adjusting screw 8 and magnet 9 are for varying a magnitude of a magnetic field applied to the YIG element 4 to vary a frequency characteristic of the magnetostatic wave device 1.

However, in the magnetostatic wave device 1, a spacing between the two magnets 6a and 6b and a spacing between the chassis 2 and the magnet 6a must be kept at predetermined distances, and it is difficult to position the YIG element, the magnets and the transducers and thus the device has inferior workability and productivity when assembled.

The inventors of the present invention have proposed that the ferromagnetic element, the magnet and the transducers are housed in a metal holder in order to facilitate positioning of them, but this results in a heavy weight of the whole device.

SUMMARY OF THE INVENTION

The principal object of the present invention is, therefore, to provide a magnetostatic wave device in which a ferromagnetic element, a magnet and transducers can be easily and precisely positioned and which has a light weight.

The magnetostatic wave device according to the present invention comprises a ferromagnetic element, a magnet for applying a magnetic field to the ferromagnetic element, and transducers provided in conjunction with the ferromagnetic element, which further comprises a holder made of synthetic resin having a ferromagnetic element housing portion for housing the ferromagnetic element, a magnet housing portion for housing the magnet in a predetermined position with respect to the ferromagnetic element, and transducer housing portions for housing the transducers in predetermined positions with respect to the ferromagnetic element.

In the ferromagnetic element housing portion of the holder, the ferromagnetic element is housed. In the magnet housing portion of the holder, the magnet is housed. In this case, the magnet is housed in a predetermined position with respect to the ferromagnetic element. Furthermore, in the transducer housing portions of the holder, the transducers are housed. In this case, the transducers are housed in predetermined positions with respect to the ferromagnetic element.

According to the present invention, a magnetostatic wave device can be obtained in which the ferromagnetic element, the magnet and the transducers can be easily and precisely positioned. Therefore, the magnetostatic wave device according to the present invention has good workability and productivity when assembled. Furthermore, according to the present invention, the holder is made of synthetic resin, thus the magnetostatic wave device has a lighter weight as compared with a device having a metal holder.

The above and further objects, features, aspects and advantages of the present invention will be more fully apparent from the following detailed description of the embodiments with accompanying drawings.

BRIEF DESCRIPTION OF THE DRAWING

FIG. 1 is an exploded perspective view showing one embodiment of the present invention.

FIG. 2 is a sectional view taken along the line II—II of FIG. 1 in the assembled state of the embodiment shown in FIG. 1.

FIG. 8 is a perspective view of a holder which is used for the embodiment of FIG. 5 and seen from its downward position.

FIG. 9 is a perspective view showing a modification of the embodiment shown in FIG. 5.

FIG. 10 is a plan view showing the embodiment of FIG. 9.

DESCRIPTION OF THE PREFERRED EMBODIMENTS

Figure 3:
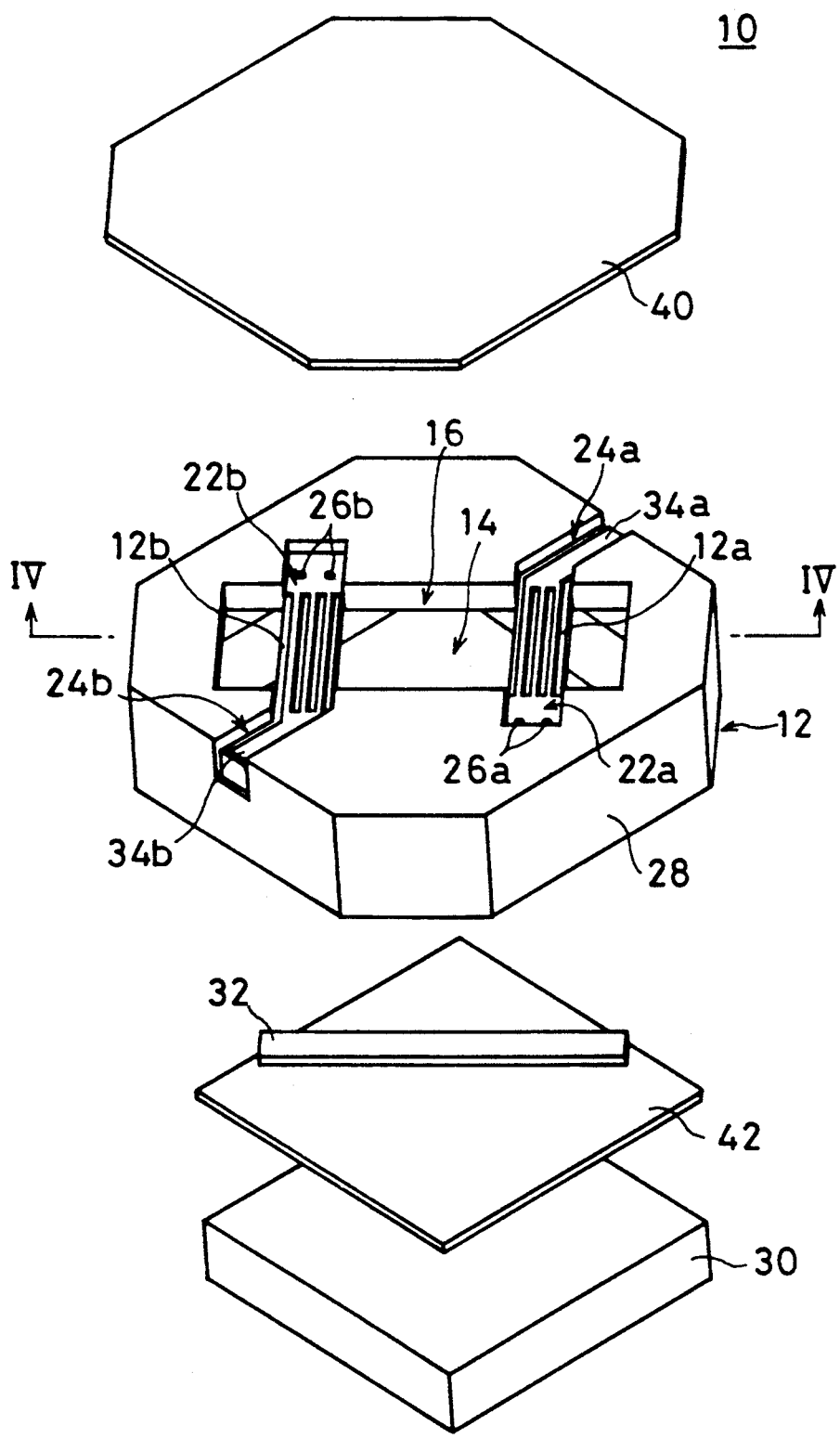
FIG. 3 is an exploded perspective view showing another embodiment of the present invention.

FIG. 1 is an exploded perspective view showing one embodiment of the present invention, and FIG. 2 is a sectional view taken along the line II—II of FIG. 1 in the assembled state of the embodiment shown in FIG. 1. The magnetostatic wave device 10 includes a synthetic resin holder 12 of, for example, a rectangular plate.

In the embodiments of FIGS. 1 and 2, the holder 12 has a recess 14 of, for example, a rectangle and plane as a magnet housing portion. The recess 14 has an opening on the undersurface of the holder 12.

On the top face of the holder 12, a recess 16 of, for example, a rectangular shape is formed as a ferromagnetic element housing portion. The recess 16 is formed into a rectangular shape in a direction of one diagonal of the holder 12. On the bottom face of the recess 16 of the holder 12, three pairs of positioning protrusions 18a are respectively formed at one end, center and the other end of the length of the rectangular shape, having a predetermined spacing in a direction of the length of the rectangular shape and having a predetermined spacing in a direction of the width of the rectangular shape. Furthermore, on the bottom face of the recess 16, two pairs of positioning protrusions 18b are respectively formed at one end and the other end of the rectangle length. Still further, on the bottom face of the recess 16, through-holes 20 are respectively formed at one end and the other end of the rectangle length.

On the top face of the holder 12, as transducer housing portions, two recesses 22a, 22b of, for example, a rectangle and two bent recesses 24a, 24b are respectively formed having a depth smaller than that of the recess 16 so as to communicate with the recess 16 respectively. In this case, the recesses 22a and 24a are respectively formed at one lengthwise end of the recess 16 and at opposite widthwise sides of the recess 16. Moreover, the bent recess 24a is formed extending to one side face of the holder 12. Similarly, the recesses 22b and 24b are respectively formed at the other lengthwise end of the recess 16 and at opposite widthwise sides of the recess 16. The recess 24b is formed extending to an opposite side face of the holder 12.

In the bottom portion of the rectangular recess 22a, two through-holes 26a are formed, and also two through-holes 26b are provided in the bottom portion of the rectangular recess 22b.

On the whole surface of the holder 12, an earth conductor layer 28 is formed by plating the surface with conducting material such as gold.

In the recess 14 of the holder 12, a magnet 30 is housed and fixed.

In the recess 16 on the top face of the holder 12, a YIG element 32 of, for example, a strip is housed as a ferromagnetic element. In this case, the YIG element 32 is positioned with the six protrusions 18a and the four protrusions 18b.

In the recesses 22a, 22b, 24a and 24b of the holder 12, two transducers, 34a and 34b are housed. That is, the transducers 34a and 34b are each formed on one principal plane of almost J-shape dielectric substrates 36a and 36b made of dielectric material such as alumina for example. One dielectric substrate 36a is fitted into the recesses 22a and 24a of the holder 12, and the other dielectric substrate 36b is fitted into the recesses 22b and 24b. Thus, when seen on the plan view, the transducers 34a and 34b cross near one end and near the other end of the YIG element 32, respectively.

At opposing ends to these transducers 34a and 34b and the dielectric substrates 36a and 36b, through-holes 38a and 38b are formed respectively, corresponding to the through-holes 26a and 26b of the holder 12. One end of the transducers 34a and 34b are connected to the earth conductor layer 28 through these through-holes 26a, 26b, 38a, and 38b.

On the top face of the holder 12, a thin plate 40 of conductive material, for example, copper is fixed as an earth conductor. In this case, since the recesses on the top face of the holder 12 are provided for the transducers 34a and 34b, the thin plate 40 does not contact with the transducers 34a and 34b.

Furthermore, the holder 12 is housed in a metal case (not shown) if necessary, and the other ends of the two transducers 34a and 34b are connected respectively to inner conductors of two coaxial connectors (not shown) as input/output terminals which penetrate the metal case. The outer conductors of these coaxial connectors are connected to the earth conductor layer 28 via the metal case.

In the magnetostatic wave device 10, the magnet 30, the YIG element 32, and the transducers 34a and 34b can be easily and precisely positioned with the holder 12. Therefore, the magnetostatic wave device 10 has good workability and productivity when assembled.

Furthermore, in the magnetostatic wave device 10, the holder 12 is made of synthetic resin, thus the weight of the device 10 is lighter than that of a device having a holder made of metal.

Still further, in the magnetostatic wave device 10, the thin plate 40 of conductive material is provided near the two transducers 34a and 34b, and the recess 16 serves as a cut-off wave path in a usable frequency range, and thus a direct wave, which reaches from one transducer to the other transducer of the two transducers 34a and 34b, is suppressed.

Furthermore, in the magnetostatic wave device 10, the magnet 30, the YIG element 32, and the transducers 34a and 34b are integrally assembled, and thus the number of components is reduced.

Figure 4:
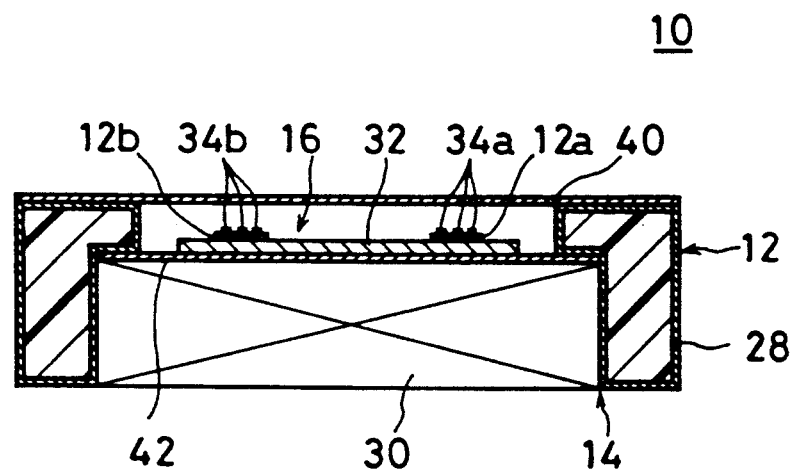
FIG. 4 is a sectional view taken along the line IV—IV of FIG. 3 in the assembled state of the embodiment shown in FIG. 3.

FIG. 3 is an exploded perspective view showing another embodiment of the present invention, and FIG. 4 is a sectional view taken along the line IV—IV of FIG. 3 in the assembled state of the embodiment shown in FIG. 3. Elements in the embodiment of FIGS. 3 and 4 which are numbered the same as elements in the previous embodiment but which are not described relative to FIGS. 3 and 4, correspond exactly to elements in the previous embodiment, and a detailed description of such elements is omitted for the sake of brevity. In the embodiment of FIGS. 3 and 4, a holder 12 is opened at one end portion, a center portion and an opposite end portion of a bottom portion of a recess 16 so as to communicate with a recess 14. That is, the holder 12 has two bridge portions 12a and 12b crossing the recess 16. The top faces of the bridge portions 12a and 12b are level with bottom faces of recesses 22a, 22b, 24a and 24b as transducer housing portions. Also, the bottom faces of the bridge portions 12a and 12b are formed above the top face of the recess 14 by a thickness of a YIG element 32.

An earth conductor layer 28 is formed on the surface of the holder 12 except the surfaces of the bridge portions 12a, 12b, the bottom faces of the recesses 22a, 22b, 24a, 24b and portions near the recesses 24a and 24b which are one side face and the other side face thereof.

The transducers 34a and 34b are formed along with the earth conductor layer 28 by plating conductor material such as gold on the top faces of the bridge portions 12a, 12b and the bottom faces of the recesses 22a, 22b, 24a, 24b of the holder 12.

In the recess 14 of the holder 12, the YIG element 32 as a ferromagnetic element, another thin plate 42 of conductive material, for example, copper as an earth conductor, and a magnet 30 are housed and fixed.

In the embodiment shown in FIGS. 3 and 4, also the magnet 30, the YIG element 32, and the transducers 34a and 34b can be easily and precisely positioned with the holder 12, thus the magnetostatic wave device of the embodiment has also good workability and productivity when assembled. Furthermore, in the embodiment, the holder 12 is also made of synthetic resin, and thus the weight of the device is lighter than that of a device having a metal holder. In the embodiment, also a direct wave from one transducer to the other transducer is further suppressed by forming two thin plates 40 and 42 of conductive material. Moreover, in the embodiment, the number of components is reduced.

Figure 5:
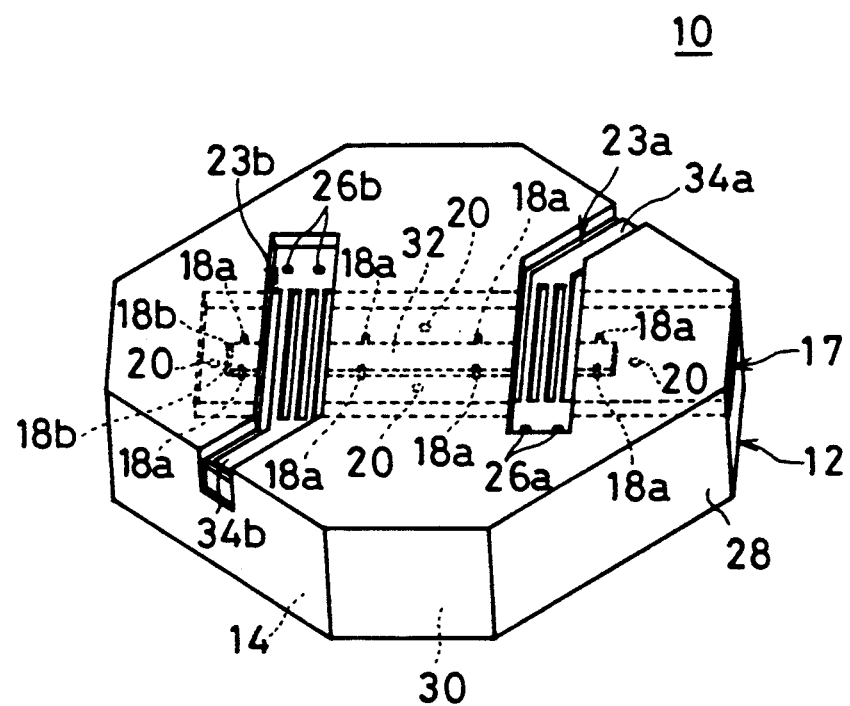
FIG. 5 is a perspective view showing still another embodiment of the present invention.
Figure 6:
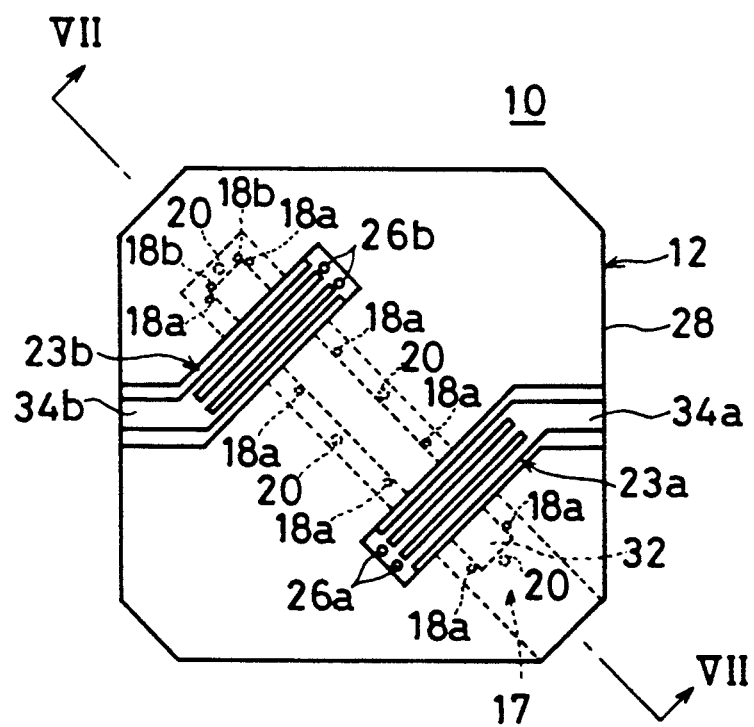
FIG. 6 is a plan view showing the embodiment of FIG. 5.
Figure 7:
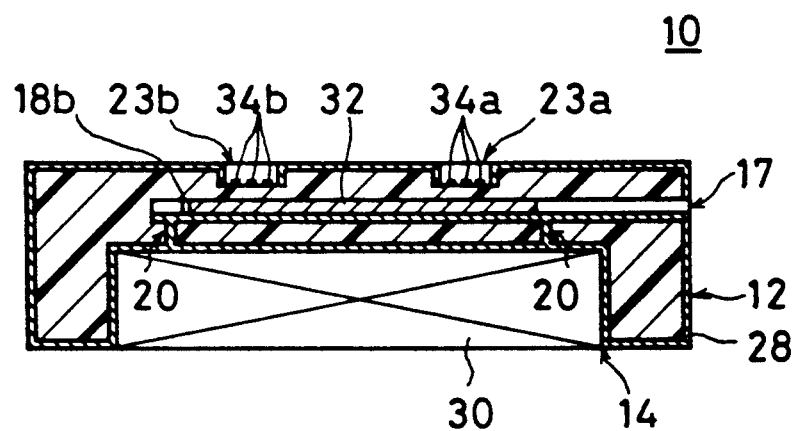
FIG. 7 is a sectional view taken along the line VII—VII of FIG. 6.
Figure 11:
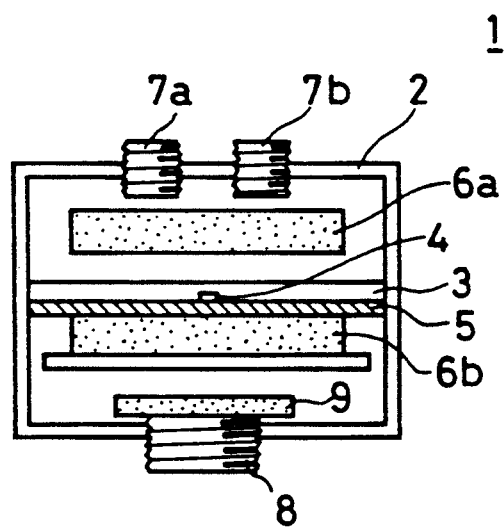
FIG. 11 is an illustrative sectional view showing one example of the conventional magnetostatic wave devices.

FIG. 5 is a perspective view showing still another embodiment of the invention, FIG. 6 is a plan view of the embodiment of FIG. 5, and FIG. 7 is a sectional view taken along the line VII—VII of FIG. 6. In the embodiment of FIGS. 5-8, almost J-shape recesses 23a and 23b are respectively formed, as transducer housing portions, on a top face of a holder 12, extending from one end toward the other end. As shown in FIGS. 7 and 8 and so on, the holder 12 is provided with two pairs of through-holes 26a and 26b at one end of the recesses 23a and 23b respectively. Elements in the embodiment of FIGS. 5-8 which are numbered the same as elements in the previous embodiments but which are not described relative to FIGS. 5-8, correspond exactly to the same elements in the previous embodiments, and a detailed description of such elements is omitted for the sake of brevity.

Furthermore, a rectangular insertion portion 17 as a ferromagnetic element housing portion is so formed between a recess 14 (FIG. 7) and recesses 23a, 23b that the portion 17 crosses the recesses 23a and 23b when seen on the plan view. The insertion portion 17 is so formed that it extends on one diagonal of the holder 12 and has an opening on a side face of the holder 12. The holder 12 is provided with a number of positioning protrusions 18a and 18b in the insertion portion 17. Furthermore, as shown in FIG. 8 and so on, the holder 12 is provided with through-holes 20 at one end, the middle and the other end of the bottom face of the insertion portion 17.

On the surface of the holder 12 except the bottom faces of the recesses 23a, 23b and the top face and the side faces of the insertion portion 17, an earth conductor layer 28 is formed. Transducers 34a and 34b are formed along with the earth conductor layer 28 by plating conducting material such as gold on the bottom faces of the recesses 23a and 23b of the holder 12. In this case, a stray inductance caused by the earth conductor layer 28 can be reduced by also forming the earth conductor layer 28 into a number of through-holes 20.

In the insertion portion 17 of the holder 12, a YIG element 32 of, for example, a strip as a ferromagnetic element is inserted and fixed. In this case, the YIG element 32 is positioned with a number of protrusions 18a and 18b. When the length, width and the height of the insertion portion 17 are so formed that they fit to the YIG element 32, these protrusions 18a and 18b become unnecessary.

The top face of the holder 12 is provided with, for example, a thin plate (not shown) of conductive material, for example, copper as an earth conductor.

In the embodiment, also the magnet 30, the YIG element 32 and the transducers 34a, 34b are easily and precisely positioned and the weight of the device is lighter than that of a device having a metal holder. Furthermore, in the embodiment, a direct wave between transducers is suppressed and the number of components is reduced.

FIG. 9 is a perspective view showing a modification of the embodiment shown in FIG. 5, and FIG. 10 is a plan view of the embodiment of FIG. 9. Elements in the embodiment of FIGS. 9 and 10 which are numbered the same as elements in the previous embodiments but which are not described relative to FIGS. 9 and 10, correspond exactly to the same elements in the previous embodiments, and a detailed description of such elements is omitted for the sake of brevity. In the embodiment shown in FIGS. 9 and 10, an insertion portion 17 formed as a ferromagnetic element housing portion is specially opened in a center portion of a holder 12 top face as compared with the embodiment shown in FIG. 5.

In the embodiment shown in FIGS. 9 and 10, a magnet 30, a YIG element 32 and transducers 34a, 34b are easily and precisely positioned, and the weight of the device can be made lighter as mentioned above. Furthermore, a direct wave between the transducers can be suppressed and a number of components is also reduced.

In each embodiment mentioned above, the YIG element 32 as a ferromagnetic element is disposed between the magnet 30 and the transducers 34a, 34b, but in the present invention, the holder may be so constructed that the transducers are disposed between the ferromagnetic element and the magnet.

Furthermore, in the above embodiments, the magnet is disposed on one side of the ferromagnetic element, but in the present invention, the holder may be so constructed that magnets are disposed on both sides of the ferromagnetic element respectively.

Meanwhile, in the above embodiments, the holder 12, the recess 14 as a magnet housing portion and the magnet 30 have rectangular shapes, but these may be formed into circles and their shapes may be optionally changed.

It will be apparent from the foregoing that, while the present invention has been described in detail and illustrated, these are only particular illustrations and examples and the invention is not limited to these. The spirit and scope of the invention is limited only by the appended claims.

What is claimed is:

1. A magnetostatic wave device comprising:
   a ferromagnetic element,
   an input transducer and an output transducer respectively provided in conjunction with said ferromagnetic element,
   said ferromagnetic element supporting a magnetostatic wave propagation from said input transducer to said output transducer in response to an electrical input signal applied to said input transducer, a magnet for applying a magnetic field that remains constant with time, to said ferromagnetic element, and, a holder comprised of synthetic resin, said holder including:

a ferromagnetic element housing portion for housing therein said ferromagnetic element, a magnet housing portion for housing therein said magnet in a predetermined position with respect to said ferromagnetic element, and transducer housing portions for housing therein said transducers in predetermined positions with respect to said ferromagnetic element, one of said ferromagnetic element housing portion and said transducer housing portions being positioned between said magnet housing portion and the other of said ferromagnetic element housing portion and said transducer housing portions.

2. A magnetostatic wave device according to claim 1, which further comprises an earth conductor layer disposed on a surface of said holder.

3. A magnetostatic wave device according to claim 2, wherein said holder includes an outer surface, and further comprising an earth conductor provided on said outer surface near said transducers.

4. A magnetostatic wave device according to claim 3, wherein said earth conductor comprises a plate of conductive material.

5. A magnetostatic wave device according to claim 1, wherein said holder includes an outer surface, and further comprising an earth conductor provided on said outer surface near said transducers.

6. A magnetostatic wave device according to claim 5, wherein said earth conductor comprises a plate of conductive material.

7. A magnetostatic wave device according to claim 1, wherein said ferromagnetic element housing portion is positioned between said magnet housing portion and said transducer housing portions.

8. A magnetostatic wave device according to claim 1, wherein each said transducer housing portion has a substantially J-shape configuration.

9. A magnetostatic wave device according to claim 1, wherein said holder has a substantially rectangular configuration.

10. A magnetostatic wave device according to claim 1, wherein said ferromagnetic element housing portion includes a substantially rectangular recess in said holder.

11. A magnetostatic wave device according to claim 10, wherein said recess has a bottom surface, and further including positioning pins extending upwardly from said bottom surface of said recess for positioning said ferromagnetic element therein.

* * * * *